(12) United States Patent
Jeong et al.

(10) Patent No.: US 9,246,064 B2
(45) Date of Patent: Jan. 26, 2016

(54) APPARATUS FOR MOUNTING OPTICAL MEMBER AND METHOD OF MANUFACTURING LIGHT EMITTING DEVICE

(71) Applicant: SAMSUNG ELECTRONICS CO., LTD., Suwon-si, Gyeonggi-do (KR)

(72) Inventors: Young Sik Jeong, Seoul (KR); Seong Ki Moon, Suwon-Gyeonggi-do (KR); Sung Il Lee, Hwaseong-Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/917,376

(22) Filed: Jun. 13, 2013

(65) Prior Publication Data

US 2014/0113391 A1   Apr. 24, 2014

(30) Foreign Application Priority Data

Oct. 24, 2012   (KR) .................. 10-2012-0118697

(51) Int. Cl.
*G01J 3/42* (2006.01)
*H01L 33/50* (2010.01)

(52) U.S. Cl.
CPC ........ *H01L 33/50* (2013.01); *H01L 2224/48091* (2013.01); *H01L 2924/0002* (2013.01); *H01L 2933/0058* (2013.01)

(58) Field of Classification Search
CPC ............. G02B 2207/00; G02B 21/006; B02B 6/4292; G01J 3/02
See application file for complete search history.

(56) References Cited

U.S. PATENT DOCUMENTS

| 4,772,123 A * | 9/1988 | Radner ............... G02B 6/4221 |
| | | 257/E33.067 |
| 8,030,839 B2 * | 10/2011 | Hosokawa .............. C04B 35/22 |
| | | 252/301.4 F |
| 8,496,360 B2 * | 7/2013 | Phillips et al. ........... 362/311.02 |
| 2007/0091293 A1 | 4/2007 | Okuno et al. |
| 2011/0122408 A1* | 5/2011 | Shibayama et al. ......... 356/334 |
| 2012/0106125 A1 | 5/2012 | Yokotani et al. |
| 2012/0127728 A1 | 5/2012 | Chang |

FOREIGN PATENT DOCUMENTS

| JP | 2003-107308 A | 4/2003 |
| JP | 2007-142371 A | 6/2007 |
| JP | 2009-271457 A | 11/2009 |
| KR | 10-2011-0107264 A | 9/2011 |

\* cited by examiner

*Primary Examiner* — Zandra Smith
*Assistant Examiner* — Andre' C Stevenson
(74) *Attorney, Agent, or Firm* — McDermott Will & Emery LLP

(57) ABSTRACT

There is provided a method of manufacturing a light emitting device including preparing a light source including a wavelength conversion unit and an optical member applied to the light source. Light is irradiated to the wavelength conversion unit to excite the wavelength conversion unit and positional information regarding the light source is obtained from light emitted from the wavelength conversion unit. A mounting position of the optical member is determined based on the obtained positional information regarding the light source. The method of manufacturing a light emitting device having excellent light characteristics can be obtained.

19 Claims, 10 Drawing Sheets

APPARATUS FOR MOUNTING OPTICAL MEMBER AND METHOD OF MANUFACTURING LIGHT EMITTING DEVICE

CROSS-REFERENCE TO RELATED APPLICATION

This application claims the priority to Korean Patent Application No. 10-2012-0118697, filed on Oct. 24, 2012, in the Korean Intellectual Property Office, the disclosure of which is incorporated herein by reference.

TECHNICAL FIELD

The present application relates to an optical member mounting apparatus and a method of manufacturing a light emitting device.

BACKGROUND

In applying a light source to a light emitting device, various attempts have been made to collect or diffuse light emitted from a light source to a spot according to applications of the light emitting device. For example, in case of a backlight unit used in displays such as notebook computers, monitors, mobile phones, TVs, an optical member that diffuses light emitted from a light source is used in order to secure uniform light emissions, while reducing an amount of light sources mounted thereon. In applying an optical member to change light distribution characteristics or an angle of beam spread, matching positions of a light source and an optical member may affect light characteristics. Thus, in the art, various attempts have been made to increase precision in matching positions of a light source and an optical member.

SUMMARY

An aspect of the present application provides a method of manufacturing a light emitting device devised to enhance precision and improve light characteristics in mounting an optical member on a light source.

Another aspect of the present application provides an optical member mounting apparatus for precisely mounting an optical member on a light source.

According to an aspect of the present application, there is provided a method of manufacturing a light emitting device. The method includes preparing a light source including a wavelength conversion unit and an optical member applicable to the light source. Light is irradiated to the wavelength conversion unit to excite the wavelength conversion unit and obtaining positional information regarding the light source from light emitted from the wavelength conversion unit. A mounting position of the optical member is determined based on the obtained positional information regarding the light source. The optical member is mounted in the determined position.

Light exciting the wavelength conversion unit may be irradiated from the outside of the light source.

The light source may include a light emitting device, and light exciting the wavelength conversion unit may have the substantially same wavelength as that of light emitted by the light emitting device.

The method may further include preparing a mounting board on which the light source is mounted. The light source is mounted on the mounting board.

The mounting board may include a fiducial mark formed thereon. The step of mounting the light source may include determining a mounting position of the light source based on the fiducial mark; and mounting the light source in the determined mounting position of the light source.

The method may further include the step of positioning the optical member in the mounting position of the light source determined based on the fiducial mark, before the obtaining of the positional information of the light source.

The step of obtaining the positional information of the light source may include detecting a light emission area of light emitted from the wavelength conversion unit; and calculating central coordinates of the detected light emission area. The positional information of the light source may be central coordinates of the detected light emission area.

The optical member may include at least one of a convex portion formed on a light output surface thereof and a concave portion formed on a light incident surface thereof.

The optical member may include the convex portion formed on the light output surface thereof and the concave portion formed on the light incident surface thereof, and the center axis of the convex portion and that of the concave portion may be aligned.

The light output surface of the optical member may further include a recess portion formed in a central region of the convex portion. The center axis of the recess portion and the center axis of the concave portion may be aligned.

In the step of mounting the optical member, a mounting position of the optical member may be determined such that an optical axis of the optical member is matched with a mounting position of the light source, and the optical member may be mounted in the determined position.

The mounting board may be a printed circuit board (PCB) on which a wiring pattern is formed to apply an electrical signal to the light source.

According to another aspect of the present application, there is provided an apparatus for mounting an optical member. The apparatus includes a moving unit for relatively moving positions of a mounting board and an optical member An excitation light source irradiates light to a light source mounted on the mounting board and has a wavelength conversion unit to excite the wavelength conversion unit. A sensing unit senses light emitted from the wavelength conversion unit. A controller generates positional information regarding the sensed light and determines a mounting position of the optical member based on the positional information.

The sensing unit may include a camera for capturing an image of light emitted from the wavelength conversion unit. The controller may generate positional information of the sensed light from the captured image.

The controller may detect a light emission area of the sensed light, generate central coordinates of the light emission area, and determine a mounting position of the optical member based on the central coordinates.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages of the present application will be more clearly understood from the following detailed description taken in conjunction with the accompanying drawings, in which.

DETAILED DESCRIPTION

Figure 1:
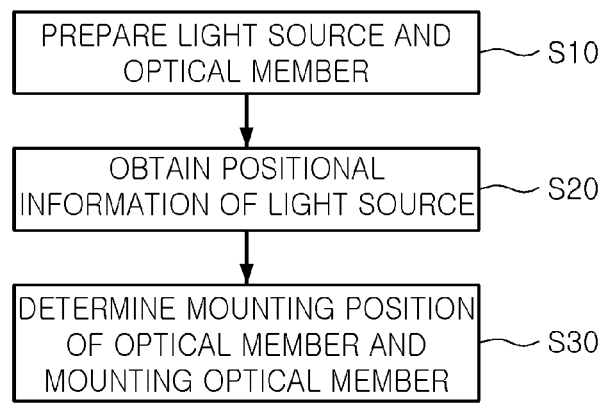
FIG. 1 is a flow chart illustrating a method of manufacturing a light emitting device according to an example of the present application.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The application may, however, be exemplified in many different forms and should not be construed as being limited to the examples set forth herein. Rather, these examples are provided so that this disclosure will be thorough and complete, and will fully convey the scope of the application to those skilled in the art. In the drawings, the shapes and dimensions of elements may be exaggerated for clarity, and the same reference numerals will be used throughout to designate the same or like components.

FIG. 1 is a flow chart illustrating a method of manufacturing a light emitting device according to an example of the present application.

Referring to FIG. 1, a method of manufacturing a light emitting device according to an example of the present application starts from an operation (S10) of preparing a light source 20 and an optical member 30. In the present example, the light source 20 may include a wavelength conversion unit 24 excited by an excitation light source to emit light having a different wavelength. Details of this process will be described with reference to FIGS. 2 through 4.

Figure 2A:
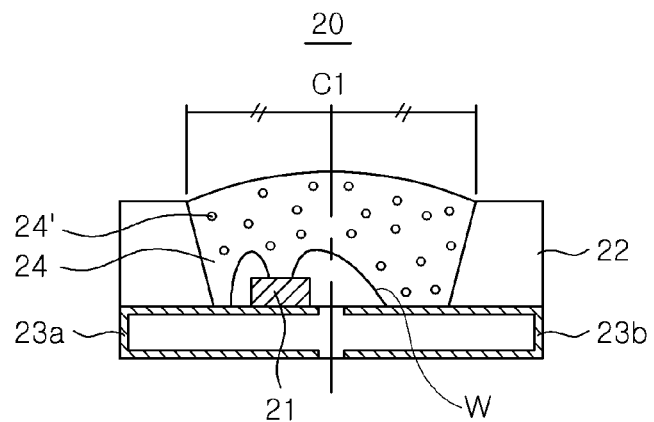
FIGS. 2A and 2B are cross-sectional views illustrating a light source that may be employed in an example of the present application.
Figure 2B:
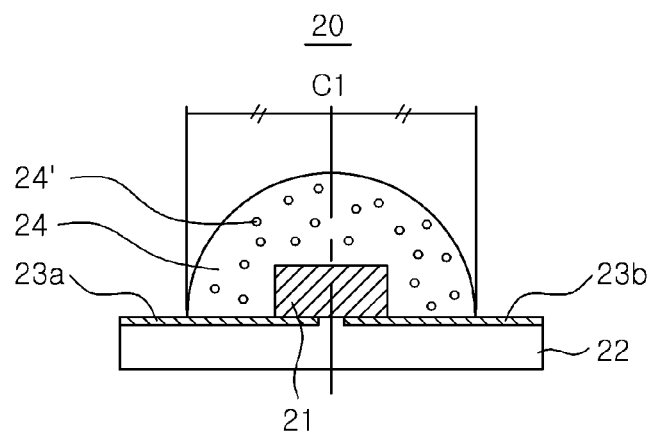

FIGS. 2A and 2B are cross-sectional views illustrating the light source 20 prepared in this operation.

Referring to FIG. 2A, the light source 20 according to the present example may be a light emitting device package including a light emitting device 21, a package body 22 having a cavity in which the light emitting device 21 is disposed, and the wavelength conversion unit 24 filling the cavity.

Any photoelectronic device may be used as the light emitting device 21 as long as it emits light when an electrical signal is applied thereto. Typically, a semiconductor light emitting device formed by epitaxially growing a semiconductor layer on a growth substrate may be used. For example, the light emitting device 21 may include an n-type semiconductor layer, a p-type semiconductor layer, and an active layer disposed therebetween, but the present application is not limited thereto. Also, the active layer may be made of a nitride semiconductor including $In_xAl_yGa_{1-x-y}N$ ($0 \le x \le 1$, $0 \le y \le 1$, $x+y \le 1$), have a single or multi-quantum well (MQW) structure, and emit blue light.

The package body 22 may include a cavity accommodating the light emitting device 21 and a pair of lead frames 23a and 23b.

The package body 22 may be made of a translucent resin or a resin having a high degree of reflectivity, and may be provided by using a polymer resin facilitating an injection molding process (i.e., a polymer resin that can be relatively easily injection-molded). However, the present application is not limited thereto and the package body 22 may be made of various other non-conductive materials.

The pair of lead frames 23a and 23b may be electrically connected to the light emitting device 21 by using a conductive wire W, or the pair of lead frames 23a and 23b may be in contact with the light emitting device 21 so as to be electrically connected. The pair of lead frames 23a and 23b may be used as terminals for applying an external electrical signal. To this end, the pair of lead frames 23a and 23b may be made of a metal having excellent electrical conductivity.

The wavelength conversion unit 24 filling the cavity may be made of a light-transmissive resin such as silicone or epoxy and include a wavelength conversion material 24' excited by an excitation light source to emit light having a wavelength different from that of light from the excitation light source. The wavelength conversion material 24' may include at least one of a phosphor and a quantum dot.

The phosphor may be a phosphor converting a wavelength of light into any one of yellow, red, and green, or a plurality of phosphor types may be mixed to convert light into a plurality of light wavelengths. The types of phosphor may be determined by a wavelength of light emitted from the light emitting device 21. In detail, the wavelength conversion material 24' may include at least one or more phosphor materials among a YAG-based phosphor material, a TAG-based phosphor material, a silicate-based phosphor material, a sulfide-based phosphor material, and a nitride-based phosphor material.

A quantum dot is a nano crystal of a semiconductor material having a diameter ranging from about 1 nm to 10 nm, exhibiting a quantum confinement effect. Quantum dots convert a wavelength of light emitted from the light emitting device 21 to generate wavelength-converted light, namely, fluorescence. The quantum dot may be, for example, an Si-based nano crystal, a group II-VI compound semiconductor nano crystal, a group III-V compound semiconductor nano crystal, a group IV-VI compound semiconductor nano crystal, or the like, and in the present example, these nano crystals may be used alone as quantum dots or a mixture thereof may be used.

Meanwhile, the wavelength conversion unit 24 may serve as a light emitting window of the light source 20, and a central point of a region defined by the wavelength conversion unit 24 may be defined as the center C1 of the light source.

FIG. 2B illustrates a light source 20 having a wavelength conversion unit 24 according to another example of the present application.

Referring to FIG. 2B, the light source 20 having the wavelength conversion unit 24 may include a light emitting device 21, a package substrate 22 having a pair of lead frames or a conductive pattern formed thereon, and a wavelength conversion unit 24 covering the light emitting device 21.

Meanwhile, the light source 20 may be mounted on a mounting board in a follow-up process. Thus, this example may further include an operation of preparing a mounting board and an operation of mounting the light source 20 on the mounting board.

Here, the mounting board may be a printed circuit board (PCB) electrically connected to the light source 20. The PCB may be made of an organic resin material including epoxy, triazine, silicone, polyimide, or the like, or any other organic resin material. Also, the PCB may be made of a ceramic material such as AlN, $Al_2O_3$, or the like, a metal, or a metal compound. Specifically, the mounting board may be a metal cover printed circuit board (MCPCB), a type of metal PCB. However, the mounting board applicable to the present application is not limited thereto and any mounting board may be employed as long as it includes a wiring for applying driving power to the light source 20.

Figure 3:
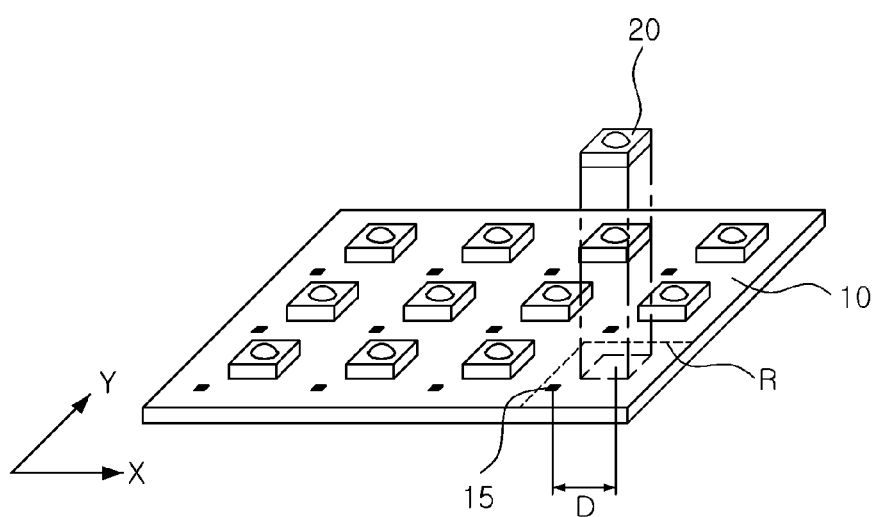
FIG. 3 is a view illustrating an operation of mounting a light source on a mounting board.

FIG. 3 is a view illustrating an operation of mounting the light source 20 on a mounting board 10.

Referring to FIG. 3, a fiducial mark 15 may be used to determine a mounting position of the light source 20 on the mounting board 10. Namely, the mounting board 10 includes the fiducial mark 15, and a method of recognizing a position in which the fiducial mark 15 is formed (or a position of the fiducial mark 15) and determining a mounting position of the light source 20 based on the position of the fiducial mark 15, e.g., a method of determining a mounting position of the light source 20 within a pre-set distance D or on pre-set coordinates, may be used.

An optical member, provided to adjust light distribution characteristics or an angle of beam spread, will be described in detail with reference to FIGS. 4A and 4B.

Figure 4A:
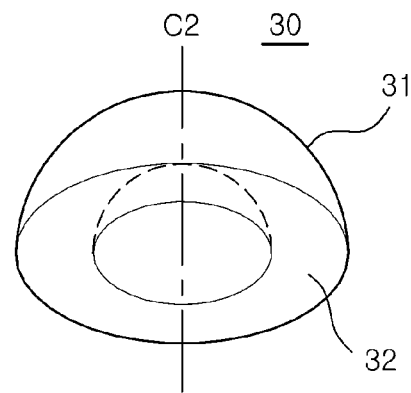
FIGS. 4A and 4B are views illustrating an optical member that may be employed in an example of the present application.
Figure 4B:
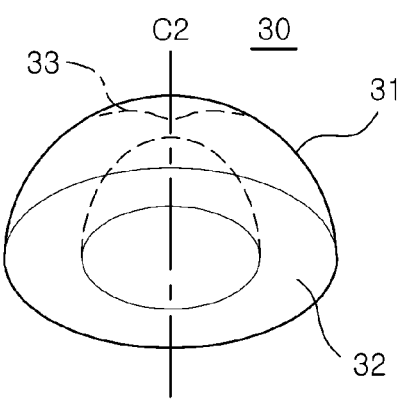

FIGS. 4A and 4B are perspective views of an optical member 30 according to an example of the present application.

The optical member 30 is not particularly limited in terms of structure, as long as they are light-transmissive, and may be made of an insulating resin having transparency or translucency such as a silicone resin composition, a modified silicone resin composition, an epoxy resin composition, a modified epoxy resin composition, an acrylic resin composition, or the like. Also, a resin having excellent waterproof properties, such as a hybrid resin including one or more of silicone, epoxy, a fluoride resin, and the like, may also be used. In addition, without being limited to an organic substance, an inorganic substance having excellent light resistivity, such as glass, silica gel, or the like, may also be used.

A surface shape of the optical member 30 may be adjusted to have a shape of a convex lens or a concave lens, an oval shape, or the like, to control light distribution.

In detail, as illustrated in FIG. 4A, the optical member 30 according to the present example may include a convex portion formed on a light output surface 31 and a concave portion formed on a light incident surface 32. Here, the center axis of the convex portion and the center axis of the concave portion may be aligned, and in this case, a straight line passing through the centers of the convex portion and the concave portion may be defined as an optical axis C2 of the optical member 30.

Also, as illustrated in FIG. 4B, the optical member 30 may further include a recess portion 33 formed in a central region of the convex portion. Here, the center axis of the recess portion 33 and the center axis of the concave portion may be aligned, and a straight line passing through the centers of the recess portion 33 and the concave portion may be defined as an optical axis C2 of the optical member 30.

The optical member 30 may be mounted on the mounting board 10 so as to be applied to the light source 20. In this case, in order to have desirable light characteristics, it is important to match the optical axis C2 of the optical member 30 and the position of the light source 20.

In detail, if the optical axis C2 of the optical member 30 and the center C1 of the light source 20 are non-aligned, light characteristics are changed to result in failure of obtaining an effect of extending an angle of beam spread, or the effect may be insignificant, or the nonaligned condition may degrade light quality. In particular, in case in which a plurality of light sources are mounted on a single mounting board 10, luminous intensity in portions between light sources 20 may not be balanced to result in a non-uniform light distribution.

Meanwhile, in the case of using the fiducial mark 15, which is used to determine a mounting position of the light source 20 as mentioned above, to determine a mounting position of the optical member 30, namely, in case of recognizing the fiducial mark 15 formed on the mounting board 10 and determining a mounting position of the optical member 30 based on the position in which the fiducial mark 15 is formed, the mounting position of the light source 20 and that of the optical member 30 may not be properly aligned due to tolerance generated in mounting the light source 20 and the optical member 30.

Figure 5:
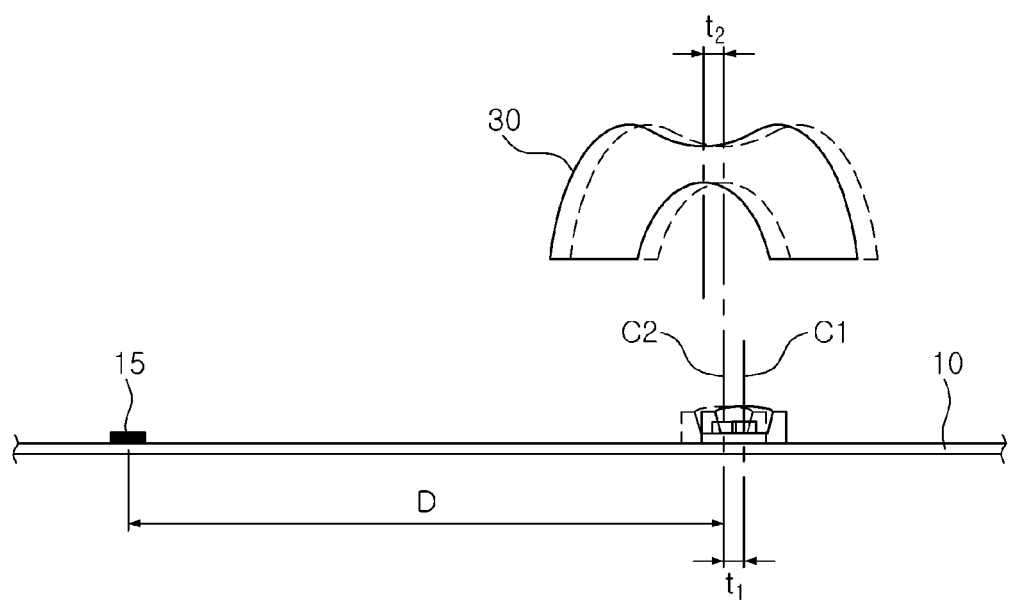
FIG. 5 is a view illustrating tolerance in mounting a light source and an optical member.

FIG. 5 is a view illustrating tolerance generated in mounting the light source 20 and the optical member 30.

Referring to FIG. 5, the light source 20 and the optical member 30 are mounted in positions spaced apart by a pre-set distance D, based on the position of the fiducial mark 15, respectively, but it can be seen that a tolerance t1 and a tolerance t2 are generated between the position in which the light source 20 was intended to be mounted and the position in which the light source 20 was actually mounted and between the position in which the optical member 30 was intended to be mounted and the position in which the optical member 30 was actually mounted, respectively.

Thus, in the case of mounting the optical member 30, it can be seen that, if the fiducial mark 15 is used as a reference without consideration of the position in which the light source 20 is actually mounted, the tolerance t1 generated when the light source 20 is mounted cannot be reflected, so the optical axis C2 of the optical member 30 and the center C1 of the light source 20 are not effectively aligned. In particular, as illustrated in FIG. 5, in the case in which the tolerance t2 in the mounting position of the optical member 30 and the tolerance t1 in the mounting position of the light source 20 are generated in mutually opposed directions, the overall light characteristics may be greatly affected.

Thus, referring back to FIG. 1, the manufacturing method according to the present example includes an operation (S20) of obtaining positional information regarding the light source 20 from light emitted from the wavelength conversion unit 24. Light emitted from the wavelength conversion unit 24 may be obtained by exciting the wavelength conversion unit 24 provided in the light source 20 by irradiating light thereto.

Light exciting the wavelength conversion unit 24 may be light output from the light emitting device 21 provided in the light source 20 by driving the light emitting device 21, or may be light irradiated from an excitation light source provided outside. In this case, since there is no need to drive the light source 20, the manufacturing process may be simplified and effective. Also, the wavelength conversion material 24' included in the wavelength conversion unit 24 may be a material set to be readily excited by light having a wavelength emitted from the light emitting device 21, so the excitation light source may emit light having the substantially same wavelength as that of light emitted by the light emitting device 21 in order to easily excite the wavelength conversion unit 24. For example, light emitted by the excitation light source may be blue light.

Upon receiving light emitted from the wavelength conversion unit 24 during this process, positional information regarding the light source, namely, information regarding a position in which the light source is actually mounted, may be obtained. This process may be performed by using an image capturing device such as a camera for recognizing light emitted from the wavelength conversion unit 24.

Figure 6A:
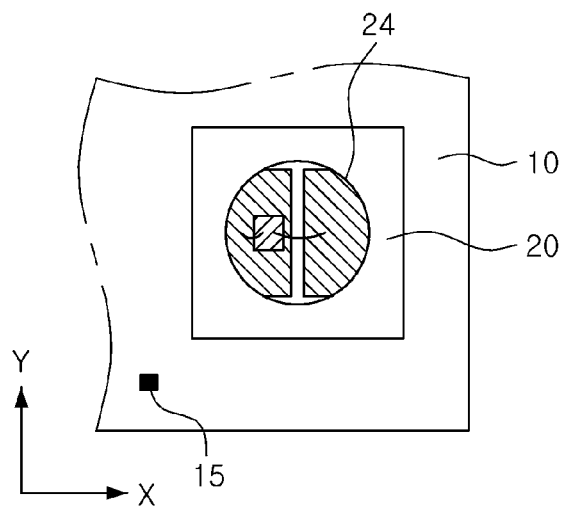
FIGS. 6A and 6B are views illustrating an operation of obtaining positional coordinates of a light source from light emitted from a wavelength conversion unit.
Figure 6B:
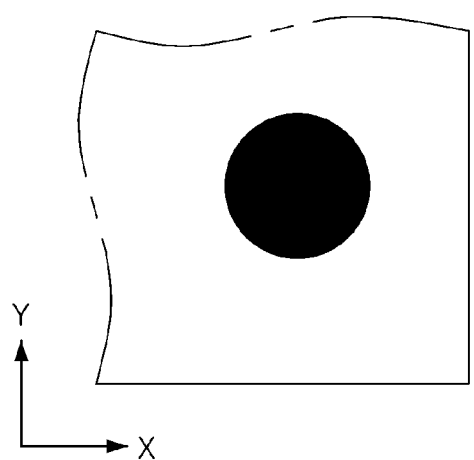

FIG. 6A is a top view of region R in FIG. 3 on the mounting board 10 on which the light source 20 is mounted, and FIG. 6B is a schematic view illustrating an image captured by the camera recognizing light emitted from the wavelength conversion unit 24 of the light source 20. Referring to FIG. 6B, information regarding a position in which the light source 20 is mounted can be easily obtained from the image obtained by capturing light emitted from the wavelength conversion unit 24.

Referring back to FIG. 1, the method of manufacturing a light emitting device according to the present example includes an operation (S30) of determining a mounting position of the optical member 30 based on the obtained positional information regarding the light source 20 and mounting the optical member 30 in the determined position.

In detail, in operation S30, a mounting position of the optical member 30 may be determined as a position in which the optical axis C2 of the optical member 30 and the light source 20 are aligned.

Meanwhile, there is no need for the method of manufacturing a light emitting device according to an example of the present application to be applied exclusively with respect to the method of positioning the optical member 30 based on the fiducial mark 15, so both methods may be employed in the present example.

Namely, first, the optical member 30 may be placed in a mounting position of the light source 20 determined based on the fiducial mark 15, and the method of correcting a mounting position of the optical member 30 based on the positional information regarding the light source 20 obtained upon recognizing light emitted from the wavelength conversion unit 24 may be subsequently applied.

In this case, the method of manufacturing a light emitting device according to an example of the present application may further include an operation of positioning the optical member 30 on the mounting position of the light source 20 determined based on the fiducial mark 15, before the operation of obtaining the positional information regarding the light source 20, and in a follow-up process, the positional information regarding the light source 20 may be obtained to determine a mounting position of the optical member 30.

According to an example of the present application, since a mounting position of the optical member 30 may be positioned upon recognizing positional information regarding the light source 20 irrespective of tolerance generated when the light source 20 is mounted on the mounting board 10, the optical axis C2 of the optical member 30 and the center C1 of the light source 20 may be effectively aligned and the light emitting device having desired light characteristics can be effectively manufactured.

Hereinafter, an example for more effectively matching the optical axis C2 of the optical member 30 and the center C1 of the light source 20 will be described.

Figure 7:
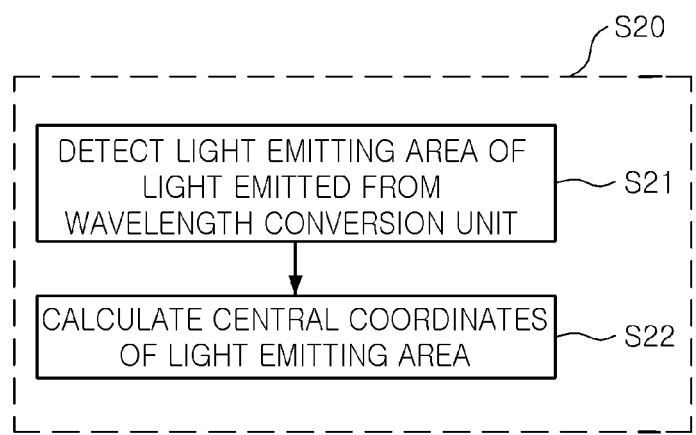
FIG. 7 is a flow chart illustrating a manufacturing process that may be performed in conjunction in an operation of obtaining positional information regarding a light source.

FIG. 7 is a flow chart illustrating a manufacturing process that may be performed in conjunction in operation S20 of obtaining positional information regarding the light source 20.

Referring to FIG. 7, operation S20 may include operation S21 for detecting a light emission area of light emitted from the wavelength conversion unit 24 and operation S22 for calculating central coordinates of the detected light emission area. In this case, the positional information regarding the light source obtained in the present example may be central coordinates of the light emission area.

Figure 8A:
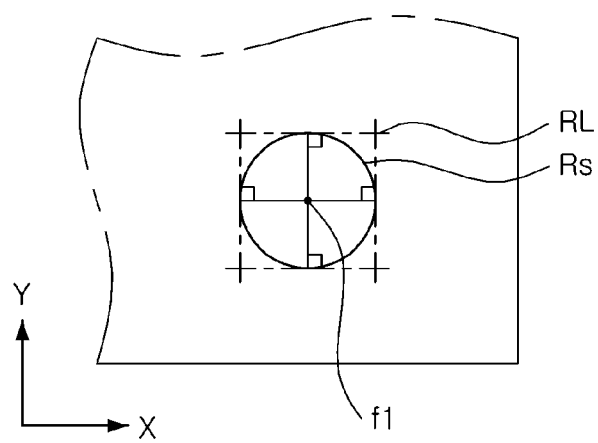
FIGS. 8A and 8B are views illustrating an operation of calculating central coordinates of a light emission area.
Figure 8B:
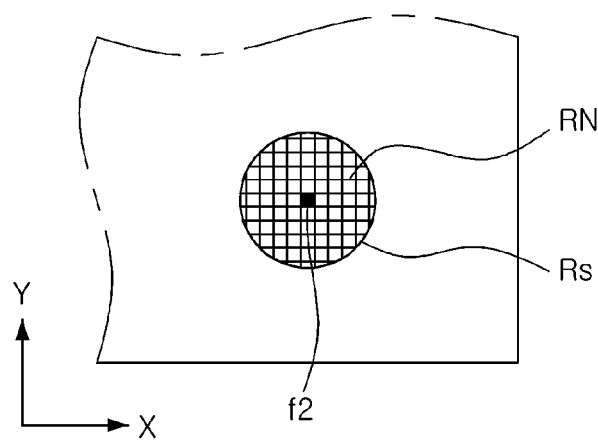

FIGS. 8A and 8B are views illustrating an image captured by a camera recognizing light emitted from the wavelength conversion unit 24 of the light source 20, in which central coordinates of the light emission area Rs are calculated.

Namely, for example, as illustrated in FIG. 8A, in the operation of detecting the light emission area Rs and the operation of calculating central coordinates of the light emission area Rs, a plurality of reference lines RL defining the area of the recognized light are set, central points of the plurality of respective reference lines RL are extracted, and an intersection point f1 of straight lines drawn in an orthogonal direction from the respective central points is subsequently calculated as central coordinates of the light emission area Rs.

Alternately, as illustrated in FIG. 8B, the area of the recognized light may be divided into a plurality of cell regions RN, a central cell area f2 corresponding to the center among the plurality of cell regions RN may be derived, and coordinates of the central cell region f2 may be calculated as central coordinates of the light emission area Rs.

However, the present application is not limited thereto and various other known methods for obtaining central coordinates from the detected area, such as a method of calculating the center of gravity of the detected light emission area Rs, or the like, may be employed and performed.

Hereinafter, an apparatus for mounting an optical member according to an example of the present application will be described.

Figure 9:
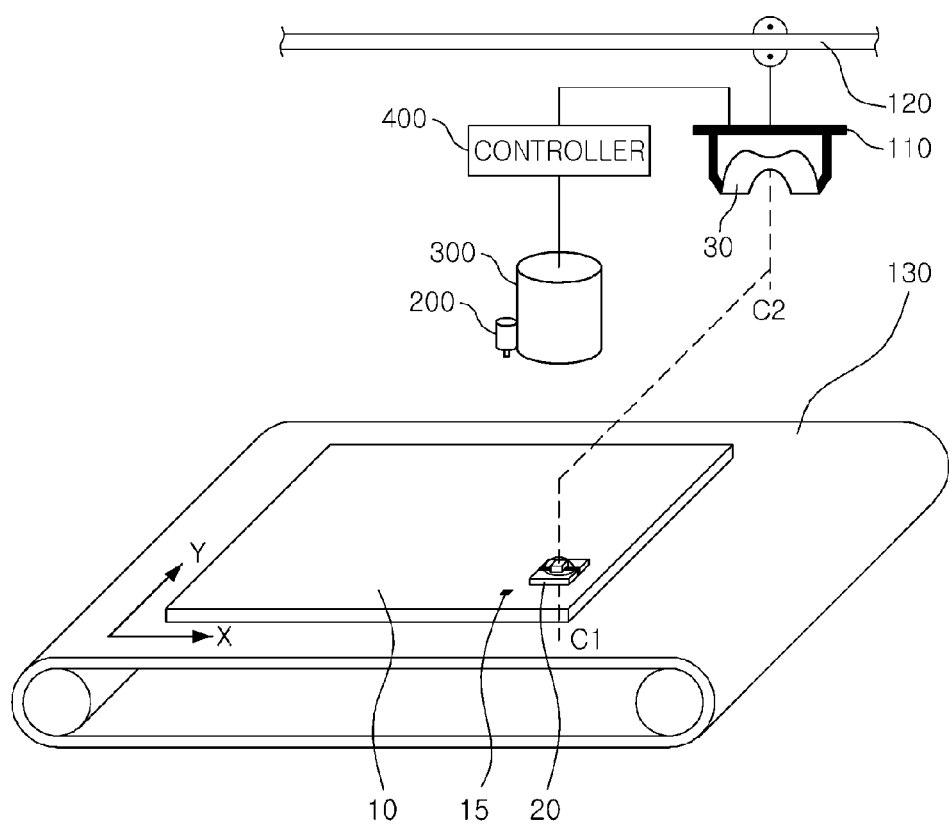
FIG. 9 is a view schematically illustrating an apparatus for mounting an optical member according to an example of the present application.

FIG. 9 is a view schematically illustrating an apparatus for mounting an optical member according to an example of the present application.

Referring to FIG. 9, the apparatus for mounting an optical member according to an example of the present application includes a moving unit relatively moving a position of the mounting board 10 and the optical member 30, an excitation light source 200, a sensing unit 300, and a controller 400.

The apparatus for mounting an optical member according to an example of the present application may be understood as an apparatus for performing portions of the operations of the method of manufacturing a light emitting device as mentioned above.

The moving unit, which relatively moves positions of the mounting board 10 and the optical member 30, may include, for example, a pickup unit 110 for picking up the optical member 30 and a pick-up transfer unit 120 moving an absolute position of the pick-up unit 110. Alternatively, a change in the relative positions of the mounting board 10 and the optical member 30 may be implemented by an absolute movement of the mounting board 10. In this case, the moving unit may include the pick-up unit 110 picking up the optical member 30 and a conveyer belt 130 transferring the mounting board 10.

The excitation light source 200 may be provided to irradiate light to the light source 20 including the wavelength conversion unit 24 to allow the wavelength conversion unit 24 to emit converted light, and in this case, the excitation light source 200 may emit light having the same wavelength as that of light emitted by the light emitting device 21 provided in the light source 20. For example, in case in which the light emitting device 21 provided in the light source 20 emits blue light, the excitation light source 200 may be set to emit blue light.

The sensing unit 300 senses light emitted from the wavelength conversion unit 24 upon being excited. For example, the sensing unit 300 may include a camera that recognizes light emitted from the wavelength conversion unit 24 and captures an image thereof.

The controller 400 may generate positional information regarding light sensed by the sensing unit 300 and determine a mounting position of the optical member 30 based on the positional information. In detail, the controller 400 may generate positional information regarding the sensed light from the image information captured by the sensing unit 300. Also, for more precise mounting, the controller 400 may be set to detect a light emission area of light sensed by the sensing unit 300, calculate central coordinates thereof, and determine a mounting position of the optical member 30 based on the central coordinates. In this case, the controller 400 may be programmed to perform the method of calculating central coordinates mentioned above in the manufacturing method.

Figure 10A:
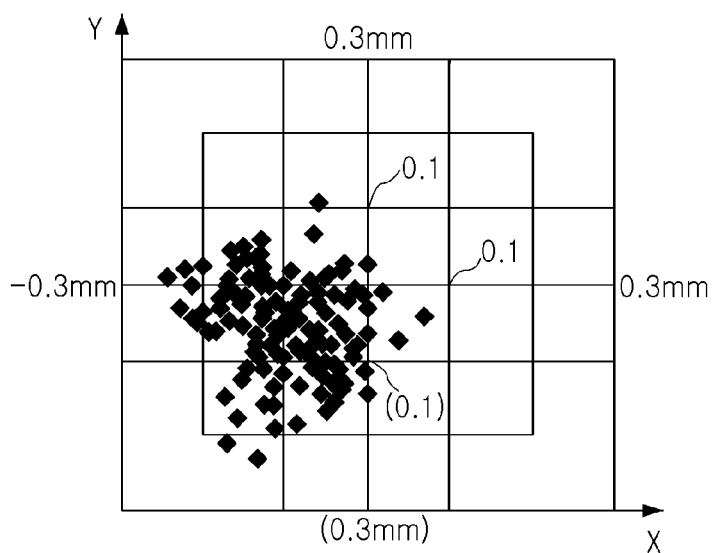
FIGS. 10A and 10B are charts illustrating experimental data showing the comparison of degrees of matching between the center of a light source and an optical axis of an optical member.
Figure 10B:
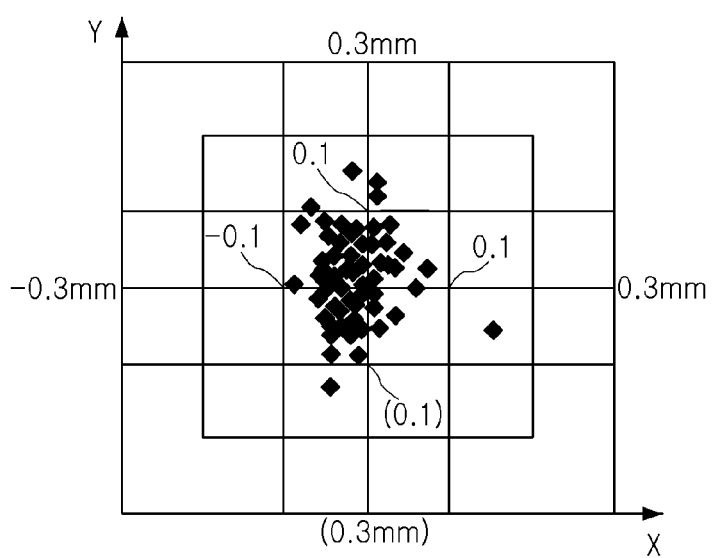

FIGS. 10A and 10B are views illustrating experimental data showing the comparison of degrees of matching between the center C1 of the light source 20 and the optical axis C2 of the optical member 30.

FIG. 10A shows a degree of matching in a case in which the light source 20 and the optical member 30 were mounted after determining mounting positions thereof based on the fiducial mark 15, and FIG. 10B shows a degree of matching in case in which the light source 20 and the optical member 30 are mounted after obtaining positional information regarding the light source 20 and determining a mounting position of the optical member 30 based on the positional information.

The comparison of the aspects of FIGS. 10A and 10B show that precision between the center C1 of the light source 20 and the optical axis C2 of the optical member 30 according to an example of the present application was effectively enhanced.

In this manner, according to an example of the present application, the light emitting device having enhanced precision and excellent light characteristics in mounting the optical member 30 on the light source 20 can be effectively manufactured.

As set forth above, according to an example of the present application, the method for effectively manufacturing a light emitting device having enhanced precision and improved light characteristics in mounting an optical member on a light source can be obtained.

According to another example of the present application, an optical member mounting apparatus for precisely mounting an optical member on a light source can be obtained.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method of manufacturing a light emitting device, the method comprising steps of:
   preparing a light source including a wavelength conversion unit and an optical member applicable to the light source;
   irradiating a light to the wavelength conversion unit to excite the wavelength conversion unit such that the wavelength conversion unit emits light having a wavelength different than a wavelength of the light irradiated to the wavelength conversion unit;
   obtaining positional information regarding the light source from the light emitted from the wavelength conversion unit;
   determining a mounting position of the optical member based on the obtained positional information regarding the light source; and
   mounting the optical member in the determined position,
   wherein light exciting the wavelength conversion unit is irradiated from outside of the light source.

2. The method of claim 1, wherein the light source comprises a light emitting device, and the light exciting the wavelength conversion unit has substantially the same wavelength as that of light emitted by the light emitting device.

3. The method of claim 2, further comprising the steps of:
   preparing a mounting board on which the light source is mounted; and
   mounting the light source on the mounting board.

4. The method of claim 3, wherein:
   the mounting board comprises a fiducial mark formed thereon, and
   the step of mounting the light source comprises:
       determining a mounting position of the light source based on the fiducial mark; and
       mounting the light source in the determined mounting position of the light source.

5. The method of claim 4, further comprising the step of:
   positioning the optical member in the mounting position of the light source determined based on the fiducial mark, before the step of obtaining the positional information of the light source.

6. The method of claim 1, wherein the step of obtaining the positional information of the light source comprises:
   detecting a light emission area of light emitted from the wavelength conversion unit; and
   calculating central coordinates of the detected light emission area,
   wherein the positional information of the light source is central coordinates of the detected light emission area.

7. The method of claim 1, wherein the optical member comprises:
   at least one of a convex portion formed on a light output surface thereof and a concave portion formed on a light incident surface thereof.

8. The method of claim 7, wherein the optical member comprises:
   the convex portion formed on the light output surface thereof and the concave portion formed on the light incident surface thereof, and the center axis of the convex portion and that of the concave portion are aligned.

9. The method of claim 8, wherein the light output surface of the optical member further comprises:
   a recess portion formed in a central region of the convex portion, and the center axis of the recess portion and the center axis of the concave portion are aligned.

10. The method of claim 7, wherein in the step of mounting the optical member, a mounting position of the optical member is determined such that an optical axis of the optical member is matched with a mounting position of the light source, and the optical member is mounted in the determined position.

11. The method of claim 3, wherein the mounting board is a printed circuit board (PCB) on which a wiring pattern is formed to apply an electrical signal to the light source.

12. An apparatus for mounting an optical member, the apparatus comprising:
- a moving unit relatively moving positions of a mounting board and an optical member;
- an excitation light source configured to irradiate a light to a light source, mounted on the mounting board and having a wavelength conversion unit, to excite the wavelength conversion unit such that the wavelength conversion unit emits light having a wavelength different than a wavelength of the light irradiated to the light source;
- a sensing unit configured to sense the light emitted from the wavelength conversion unit; and
- a controller configured to:
  - generate positional information regarding the sensed light, and
  - determine a mounting position of the optical member based on the positional information, wherein light exciting the wavelength conversion unit is irradiated from outside of the light source.

13. The apparatus of claim 12, wherein:
- the sensing unit comprises a camera configured to capture an image of light emitted from the wavelength conversion unit, and
- the controller is configured to generate positional information of the sensed light from the captured image.

14. The apparatus of claim 12, wherein the controller is configured to:
- detect a light emission area of the sensed light and generate central coordinates of the light emission area, and
- determine a mounting position of the optical member based on the central coordinates.

15. The apparatus of claim 12, wherein the moving unit includes a pick-up unit for picking up the optical member and a conveyer belt for transferring the mounting board.

16. The apparatus of claim 15, wherein the pick-up unit is conveyed with a pick-up transfer unit.

17. The apparatus of claim 12, wherein the optical member is light-transmissive.

18. The apparatus of claim 12, wherein the optical member comprises a convex lens, a concave lens, or an oval shaped lens.

19. The apparatus of claim 12, wherein the light source comprises a photoelectronic device.

* * * * *